(12) United States Patent
Akagawa et al.

(10) Patent No.: US 9,620,736 B2
(45) Date of Patent: Apr. 11, 2017

(54) ORGANIC EL DEVICE AND ELECTRONIC APPARATUS

(71) Applicant: SEIKO EPSON CORPORATION, Tokyo (JP)

(72) Inventors: Suguru Akagawa, Matsumoto (JP); Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/008,645

(22) Filed: Jan. 28, 2016

(65) Prior Publication Data
US 2016/0226018 A1  Aug. 4, 2016

(30) Foreign Application Priority Data

Feb. 4, 2015 (JP) ................. 2015-020008

(51) Int. Cl.
| | | |
|---|---|---|
| *H01L 35/24* | (2006.01) | |
| *H01L 51/00* | (2006.01) | |
| *H01L 51/52* | (2006.01) | |
| *H01L 27/32* | (2006.01) | |

(52) U.S. Cl.
CPC ...... *H01L 51/5246* (2013.01); *H01L 51/5253* (2013.01); *H01L 27/322* (2013.01); *H01L 51/524* (2013.01)

(58) Field of Classification Search
CPC . H01L 51/5237; H01L 51/56; H01L 51/5246; H01L 27/322

USPC .......................................................... 257/40
See application file for complete search history.

(56) References Cited

U.S. PATENT DOCUMENTS

| | | | | |
|---|---|---|---|---|
| 9,362,520 | B2 * | 6/2016 | Sato | H01L 27/3211 |
| 2013/0299789 | A1 | 11/2013 | Yamazaki et al. | |
| 2014/0117334 | A1 | 5/2014 | Nakamura et al. | |
| 2015/0287959 | A1 * | 10/2015 | Hanamura | H01L 51/5246 257/40 |
| 2016/0017186 | A1 * | 1/2016 | Aoyama | H01L 51/5253 257/40 |
| 2016/0087237 | A1 * | 3/2016 | Oh | H01L 51/5203 257/40 |

FOREIGN PATENT DOCUMENTS

| | | |
|---|---|---|
| JP | 2008-005986 A | 1/2008 |
| JP | 2011-119169 A | 6/2011 |

(Continued)

*Primary Examiner* — David S Blum
(74) *Attorney, Agent, or Firm* — Oliff PLC

(57) ABSTRACT

An organic EL device includes an element substrate above which an organic EL element is provided; a counter substrate arranged so as to face the element substrate; a sealing layer arranged between the organic EL element and the counter substrate, and having at least a first sealing layer made from an inorganic material, a planarized second sealing layer, and a third sealing layer formed from an inorganic material; and a filler arranged between the sealing layer and the counter substrate, in which the counter substrate is arranged in a region spaced by a predetermined gap from any end portion of the element substrate, the filler is arranged so as to protrude to the gap from between the element substrate and the counter substrate, and the end portion of the second sealing layer is covered by the filler.

18 Claims, 10 Drawing Sheets

(56) References Cited

FOREIGN PATENT DOCUMENTS

| JP | 2012-069529 A | 4/2012 |
| JP | 2012-209116 A | 10/2012 |
| JP | 2014-089803 A | 5/2014 |
| JP | 2014-197522 A | 10/2014 |

* cited by examiner

ORGANIC EL DEVICE AND ELECTRONIC APPARATUS

BACKGROUND

1. Technical Field

The present invention relates to an organic EL device and an electronic apparatus.

2. Related Art

The organic electroluminescence (EL) device has a structure in which a light emitting layer formed from a light emitting material is interposed between an anode (pixel electrode) and a cathode (counter electrode). The organic EL devices are adhered to an element substrate and a counter substrate via a sealing material and a filler. A connection terminal that electrically connects the organic EL device and an external apparatus is provided on the element substrate.

JP-A-2014-89803 discloses an organic EL device with a structure in which an end portion of the element substrate and an end portion of the counter substrate are arranged at approximately the same position in plan view, except for a region in which the connection terminal is arranged.

However, in a case where a plurality of organic EL devices is formed at the same time on a large substrate (motherboard), when formed so that the end portions of the element substrate and the counter substrate have substantially the same position, a problem arises of the filler protruding to the neighboring organic EL device side.

Meanwhile, when formed so that the end portion of the counter substrate is further to the inside (so as to become smaller) in plan view than the end portion of the element substrate, a problem arises of the part of the organic EL device to be protected (for example, a sealing film) protrudes. When the part to be protected is to be protected by the counter substrate, a problem arises of the non-display region becoming larger.

SUMMARY

The invention can be realized in the following forms or application examples.

Application Example 1

According to this application example, there is provided an organic EL device, including a first substrate on which an organic EL element is provided; a second substrate arranged so as to face the first substrate; a sealing layer arranged between the organic EL element and the second substrate, and having at least a first sealing layer made from an inorganic material, a planarized second sealing layer, and a third sealing layer formed from an inorganic material; and a filler arranged between the sealing layer and the second substrate, in which the second substrate is arranged in a region spaced by a predetermined gap from any end portion of the first substrate, the filler is arranged so as to protrude to the gap from between the first substrate and the second substrate, and the end portion of the second sealing layer is covered by the filler.

According to the application example, since the second sealing layer is covered by the filler layer and the second substrate in plan view, the sealing layer can be protected from external impact, and it is possible to suppress breakage of the second sealing layer. Thus, the infiltration of moisture and the like into the organic EL element via the sealing layer can be suppressed. Since the end portion of the second substrate is arranged so as to be further to the inside (so as to become smaller) than the end portion of the first substrate, the protrusion amount of the filler to the end portion side of the substrate can be suppressed, and the non-display region becoming excessively large may be suppressed. Thus, the filler protruding into the side of the neighboring organic EL device as in a case of forming with a large substrate (motherboard) can be suppressed.

Application Example 2

In the organic EL device according to the application example, it is preferable that the end portion of the second sealing layer is arranged further to the inside than the end portion of the second substrate in plan view.

According to the application example, since the end portion of second sealing layer is arranged so as to be further to the inside than the end portion of the second substrate, the amount that the filler that covers the second sealing layer protrudes from end portion of the second substrate to the outside may be suppressed. Thus, the filler protruding into the region of the neighboring organic EL device as in a case of forming with a large substrate (motherboard) can be suppressed.

Application Example 3

In the organic EL device according to the application example, it is preferable that a distance from the end portion of the filler to the end portion of the second sealing layer is longer than the thickness of the filler between the second sealing layer and the second substrate.

According to the application example, regarding the filler that covers the second sealing layer, since the distance from the end portion of the second sealing layer to the end portion of the filler is longer than the thickness of the filler between the second sealing layer and the second substrate, it is possible to protect the sealing layer from external impact by means of the filler.

Application Example 4

In the organic EL device according to the application example, it is preferable that the second substrate is formed with a taper to the outer edge of the side on which the filler is arranged.

According to the application example, since the taper is formed on the outer edge of the filler side on the second substrate, it is possible for the part where the second substrate comes in contact with the filler to be further to the inside than the end portion side of the second substrate. Thus, the amount that the filler protrudes from the end portion of the second substrate to the outside can be suppressed, and it is possible for the filler protruding to the region of the neighboring organic EL device, as in a case of forming with a large substrate (motherboard) to be suppressed.

Application Example 5

In the organic EL device according to the application example, it is preferable that the taper is formed at a position not overlapping the second sealing layer in plan view.

According to the application example, since the taper is formed in a region not overlapping the second sealing layer, it is possible to cover the second sealing layer with the filler, and along therewith, to keep the end portion of the filler so as to be between the end portion of the second sealing layer and the end portion of the second substrate. Thus, the filler can be made not to spread excessively from the end portion of the second sealing layer to the outside, and it is possible to prevent the filler from protruding to the region of a neighboring organic EL device.

Application Example 6

In the organic EL device according to the application example, it is preferable that a display region is further included at a region that includes the organic EL element in plan view, and the distance from an edge of the display region to an end portion of the second sealing layer is longer than the distance from an end portion of the second sealing layer to the end portion of the second substrate.

According to the application example, since the distance from the end portion of the second sealing layer to the end portion of the second substrate is shorter (thinner), it is possible for the end portion of the second sealing layer being excessively covered with the filler to be suppressed. Thus, the filler can be prevented from protruding into the region of a neighboring organic EL device.

Application Example 7

In the organic EL device according to the application example, it is preferable that a projection is provided on the third sealing layer and further to the outside than the second sealing layer in plan view.

According to the application example, by providing the projection, it is possible for excessive filler protruding (flowing) to the neighboring region when the end portion of the second sealing layer is covered by the filler to be suppressed. Application Example 8

In the organic EL device according to the application example, it is preferable that the projection is formed by any material of a color filter, a barrier layer arranged between the color filters, and an overcoating layer.

According to the application example, by forming the projection using the above materials, it is possible to form the projection without adding a new manufacturing process.

Application Example 9

According to this application example, there is provided an electronic apparatus, including the above-described organic EL device.

According to the application example, since the organic EL device is provided, it is possible to provide a highly reliable electronic apparatus.

BRIEF DESCRIPTION OF THE DRAWINGS

The invention will be described with reference to the accompanying drawings, wherein like numbers reference like elements.

DESCRIPTION OF EXEMPLARY EMBODIMENTS

Below, specific embodiments of the invention will be described according to the drawings. The drawings used are displayed after enlarging or reducing as appropriate in order that the portions described are recognizable.

Moreover, in the following forms, for example, a case where "on a substrate" is disclosed indicates a case where arrangement is performed so as to contact the top of the substrate, a case where arrangement is performed via another constituent component on top of the substrate, or a case where a portion is arranged so as to contact the top of the substrate, and a portion is arranged via the other constituent component.

First Embodiment

Organic EL Device

Figure 1:
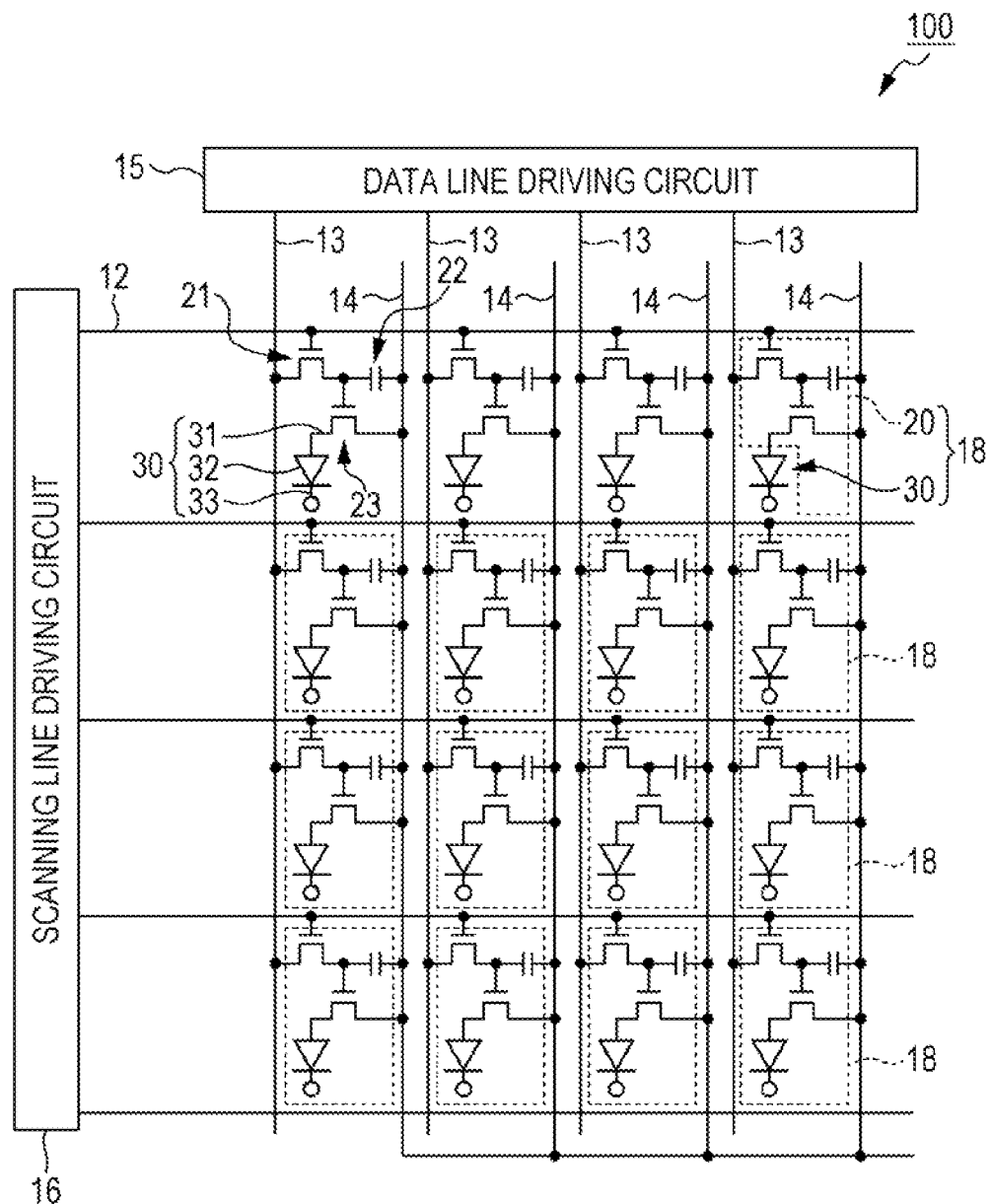
FIG. 1 is an equivalent circuit diagram showing an electrical configuration of an organic EL device according to a first embodiment.
Figure 2:
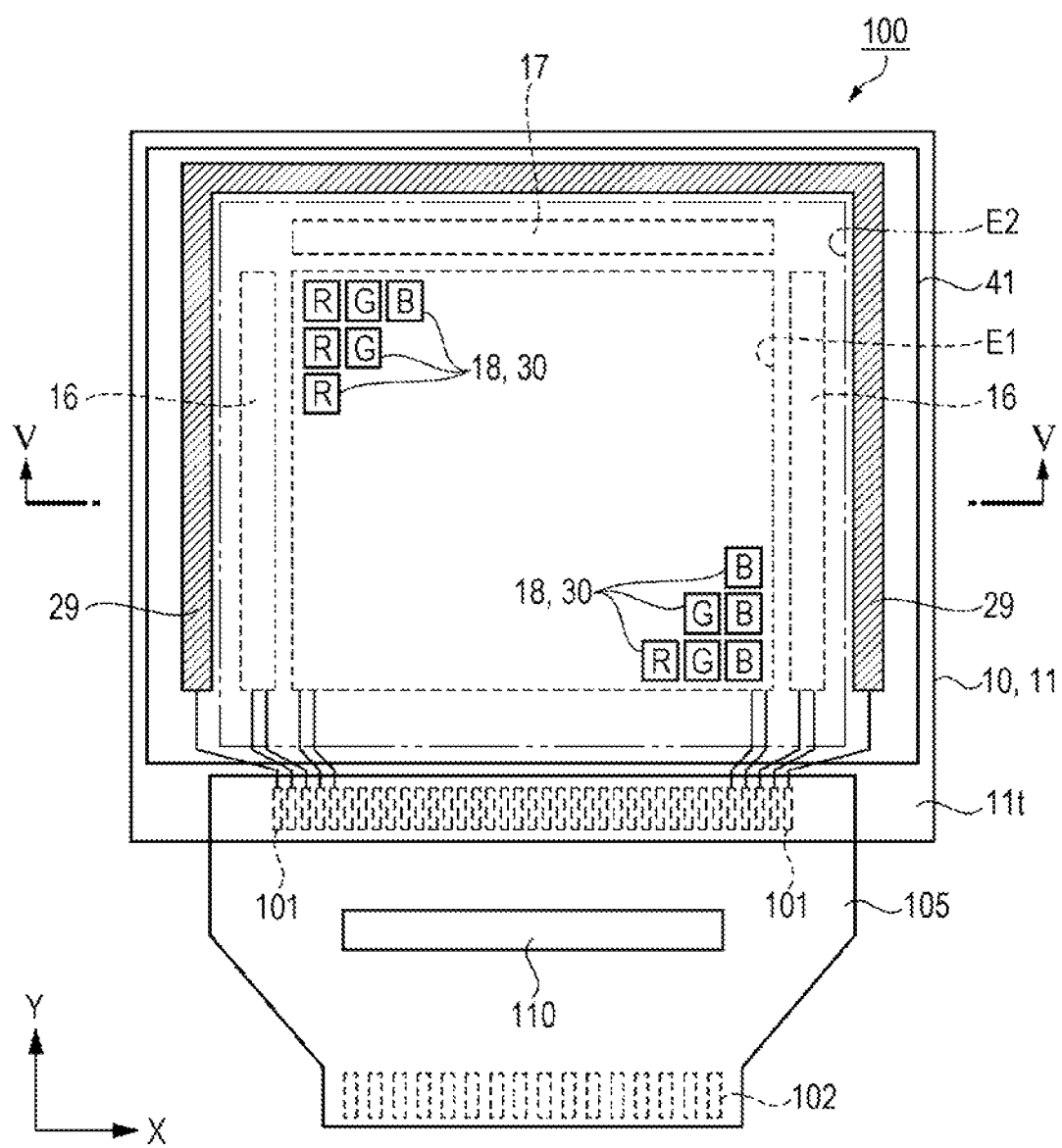
FIG. 2 is a schematic plan view showing a configuration of the organic EL device.
Figure 3:
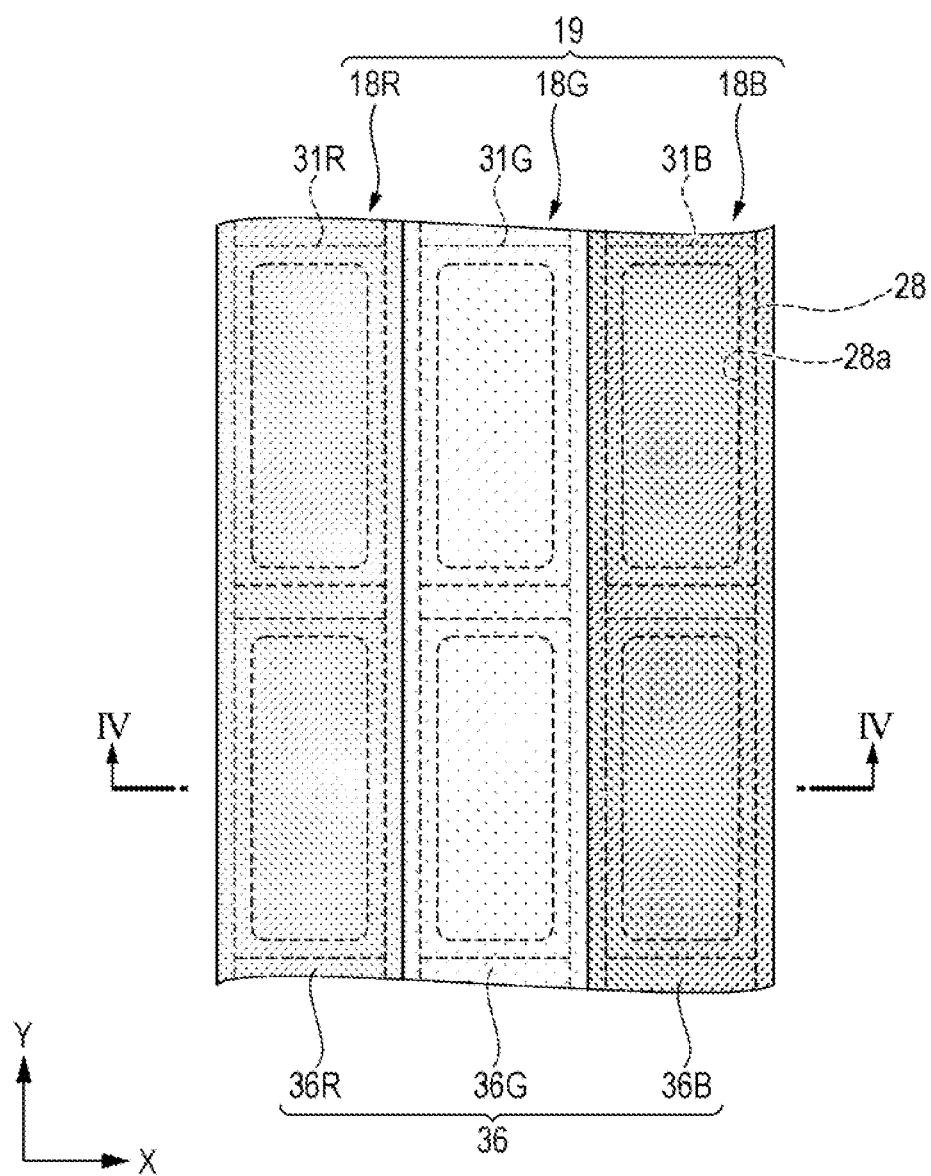
FIG. 3 is a schematic plan view showing a pixel arrangement.

First, the organic electroluminescence (EL) device of the embodiment will be described with reference to FIGS. 1 to 3. FIG. 1 is an equivalent circuit diagram showing an electrical configuration of the organic EL device of the first embodiment; FIG. 2 is a schematic plan view showing the configuration of the organic EL device of the first embodiment; and FIG. 3 is a schematic plan view showing a pixel arrangement in the first embodiment.

As shown in FIG. 1, the organic EL device 100 of the embodiment includes plurality of scanning lines 12 and a plurality of data lines 13 that intersect one another, and a plurality of power lines 14 arranged in a line for each of the plurality of data lines 13. The organic EL device includes a scanning line driving circuit 16 to which the plurality of scanning lines 12 is connected, and a data line driving circuit 15 to which the plurality of data lines 13 is connected. A plurality of sub-pixels 18 that is arranged in a matrix form corresponding to each intersection of the plurality of scanning lines 12 and the plurality of data lines 13 is included.

The sub-pixels 18 include an organic EL element 30 that is a light emitting element and a pixel circuit 20 that controls the driving of the organic EL element 30.

The organic EL element 30 includes a pixel electrode 31 that functions as an anode, a counter electrode 33 that functions as a cathode, and a functional layer 32 that includes an organic light emitting layer provided between the pixel electrode 31 and the counter electrode 33. It is possible for such an organic EL element 30 to be electrically denoted as a diode.

The pixel circuit 20 includes a switching transistor 21, a storage capacitor 22, and a driving transistor 23. It is possible for the two transistors 21 and 23 to be configured using an n-channel or p-channel thin film transistor (TFT) or a MOS transistor.

The gate of the switching transistor 21 is connected to the scanning line 12, one of the source or drain is connected to the data line 13, and the other of the source and drain is connected to the gate of the driving transistor 23.

One of the source or drain of the driving transistor 23 is connected to the pixel electrode 31 of the organic EL element 30, and the other of the source and drain is connected to the power line 14. The storage capacitor 22 is connected between the gate of the driving transistor 23 and the power line 14, When the scanning line 12 is driven and the switching transistor 21 thereby enters an on state, and the potential based on the image signal supplied from the data line 13 at this time is held by the storage capacitor 22 via the switching transistor 21.

The on and off states of the driving transistor 23 are determined according to the potential of the storage capacitor 22, that is, the gate potential of the driving transistor 23. When the driving transistor 23 is in the on state, a current with an amount according to the gate potential flows from the power line 14 to the functional layer 32 interposed between the pixel electrode 31 and the counter electrode 33 via the driving transistor 23. The organic EL element 30 emits light according to the current amount flowing to the functional layer 32.

The configuration of the pixel circuit 20 is not limited thereto. For example, a light emission control transistor that controls the electrical connection between the pixel electrode 31 and the driving transistor 23 and that is provided between the pixel electrode 31 and the driving transistor 23 may be provided.

As shown in FIG. 2, the organic EL device 100 includes an element substrate 10 as a first substrate, and a counter substrate 41 as a second substrate arranged so as to face the element substrate 10. A display region E1 (displayed by a dotted line in the drawing), and a dummy region E2 (displayed with the double dashed line in the drawing) outside the display region E1 are provided on the element substrate 10. The outside of the dummy region E2 is a non-display region, The sub-pixels 18 are arranged in a matrix form in the display region E1. The sub-pixel 18 is provided with the organic EL element 30 that is the above-described light emitting element, and is configured so that emitted light with any color from red (R), green (G), and blue (B) is obtained according to the operation of the switching transistor 21 and the driving transistor 23.

In the embodiment, the sub-pixels 18 from which the same color of light emission is obtained are arranged in a first direction, and the sub-pixels 18 from which different colors of light emission is obtained are arranged in a second direction that intersects (orthogonal to) the first direction, a so-called striped method of sub-pixel arrangement 18. Below, description is made with the first direction as the Y direction and the second direction as the X direction. The arrangement of the sub-pixels 18 on the element substrate 10 is not limited to the stripe format, and may be a mosaic format or a delta format.

A peripheral circuit for mainly causing the organic EL element 30 of each sub-pixel 18 to emit light is provided in the dummy region E2. As shown in FIG. 2, a pair of scanning line driving circuits 16 is provided extending in the Y direction at positions interposing the display region E1 in the X direction. A scanning circuit 17 is provided at a position along the display region E1 between the pair of scanning line driving circuits 16.

A wiring layer 29 extending in the Y direction along the pair of scanning line driving circuits 16 and in the X direction along the scanning circuit 17, and arranged so as to surround the dummy region E2 is included on the element substrate 10. The counter electrode 33 of the organic EL element 30 is formed as a shared cathode across the plurality of organic EL elements 30, that is, the plurality of sub-pixels 18. The counter electrode 33 is formed so as to reach from the display region E1 to the non-display region, and is electrically connected to the wiring layer 29 in the non-display region.

The element substrate 10 is larger than the counter substrate 41, and a plurality of connection terminals 101 for achieving electrical connection with external driving circuits is arranged in the X direction on one edge portion (edge portion between the end portion of the substrate 10 and the dummy region E2 in the lower portion of the drawing; below, referred to as terminal portion lit) protruded from the counter substrate 41 in the Y direction.

A flexible circuit substrate (FPC) 105 is connected to the plurality of connection terminals 101. A driving IC 110 is mounted to the FPC 105. The driving IC 110 includes the above-described data line driving circuit 15.

The FPC 105 includes an input terminal 102 connected to the input side of the driving IC 110 via a wiring, and an output terminal (not shown in the drawings) connected to the output side of the driving IC 110 via a wiring.

The data line 13 and the power line 14 of the element substrate 10 side are electrically connected to the driving IC 110 via the connection terminal 101 and the FPC 105. The wiring connected to the scanning line driving circuit 16 and the scanning circuit 17 is electrically connected to the driving IC 110 via the connection terminal 101 and the FPC 105.

The counter electrode 33 as a shared cathode is also electrically connected to the driving IC 110 via the wiring layer 29 and the connection terminal 101, and the FPC 105. Accordingly, any of the plurality of connection terminals 101 arranged on the terminal portion lit is supplied with a control signal, driving potential (VDD) or the like from the driving IC 110.

It is possible for a know method to be used as the method for electrically connecting the plurality of connection terminals 101 on the element substrate 10 side and the output terminal on the FPC 105 side, and examples include a method using a thermoplastic anisotropic conductive film and a method using a thermosetting anisotropic adhesive.

Next, the configuration of the sub-pixel 18 and the planar arrangement thereof will be described with reference to FIG. 3. The organic EL device 100 in the embodiment is configured by combining an organic EL element 30 from which white light emission is obtained, and a color filter 36 that includes red (R), green (G), and blue (B) colored layers.

As shown in FIG. 3, the sub-pixel 18R from which red (R) light emission is obtained, the sub-pixel 18G from which green (G) light emission is obtained, and the sub-pixel 18B from which blue (B) light emission is obtained are arranged in parallel in this order in the X direction. The sub-pixels 18 from which the same color of light emission is obtained are arranged in parallel in the Y direction. The configuration performs display with the three sub-pixels 18R, 18G, and 18B arranged in parallel in the X direction as one pixel 19.

In the embodiment, the arrangement pitch of the sub-pixels 18R, 18G, and 18B in the X direction is less than 5 µm. The sub-pixels 18R, 18G, and 18B are arranged spaced with a gap of 0.5 μm to 1.0 μm in the X direction. The arrangement pitch of the sub-pixels 18R, 18G, and 18B in the Y direction is less than approximately 10 μm.

The pixel electrodes 31 in the sub-pixels 18 are substantially rectangular, and the long direction thereof is arranged along the Y direction. The pixel electrodes 31 are also referred to as the pixel electrodes 31R, 31G, and 31B corresponding to the light emission color.

An insulating barrier 28 is formed while covering the outer edge of each pixel electrode 31R, 31G, and 31B. Thus, the opening portion 28a is formed on each pixel electrode 31R, 31G, and 31B, and the pixel electrodes 31R, 31G, and 31B each contact the functional layer 32 in the opening portion 28a provided in the barrier 28. The planar shape of the opening portion 28a is also a substantially rectangular.

The wording substantially rectangular includes a rectangle, a shape in which the corners of a rectangle are rounded, a shape in which the short edge side of the rectangle is a circular arc, and the like.

The red (R) colored layer 36R of the color filter 36 is formed so as to overlap the plurality of pixel electrodes 31R arranged in parallel in the Y direction. The green (G) colored layer 36G is formed so as to overlap the plurality of pixel electrodes 31G arranged in the Y direction. The blue (B) colored layer 36B is formed so as to overlap the plurality of pixel electrodes 31B arranged in the Y direction. That is, the different colors of colored layer 36R, 36G, and 36B are formed in a striped form extending in the Y direction, and formed alternately contacting in the X direction.

Figure 4:
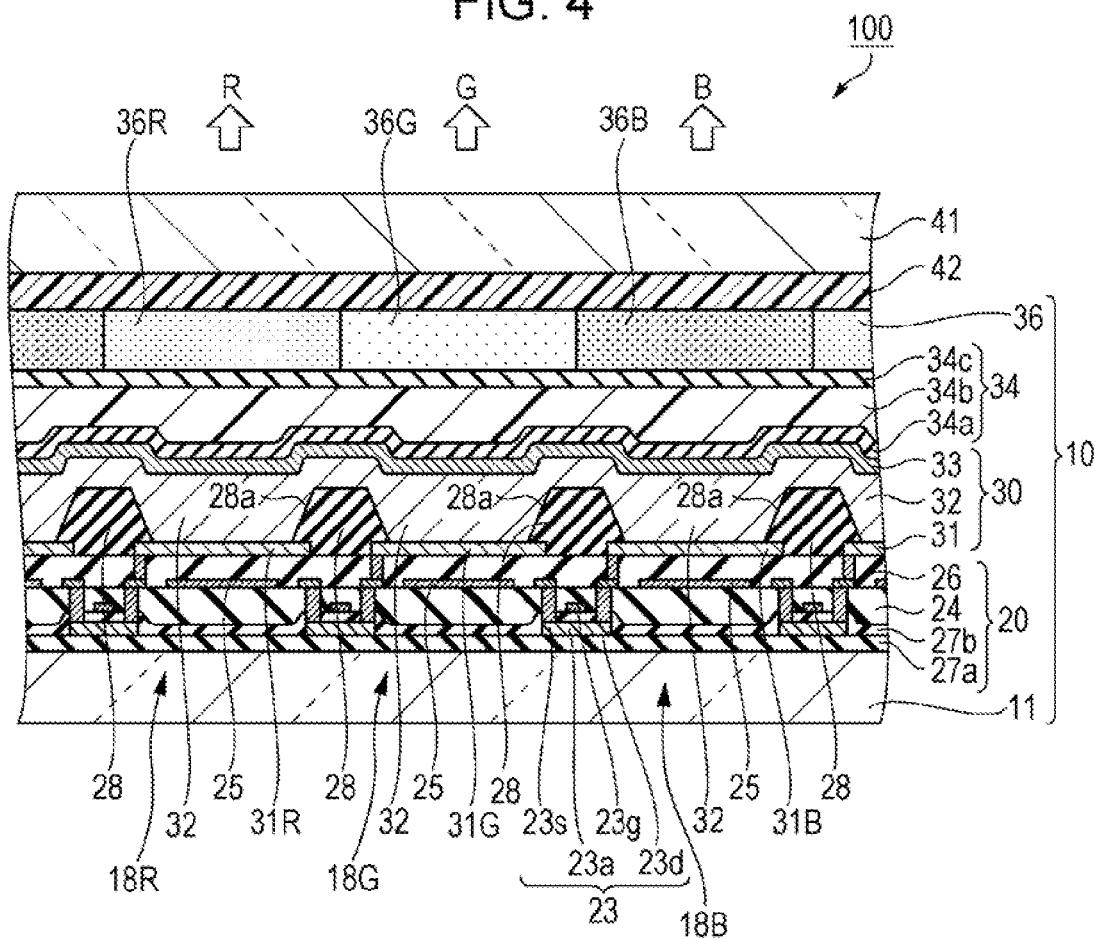
FIG. 4 is a schematic cross-sectional view of the organic EL device shown in FIG. 3 taken along the line IV-IV.

Next, the structure of the sub-pixels of the organic EL device 100 will be described with reference to FIG. 4. FIG. 4 is a schematic cross-sectional view showing the structure of the organic EL device taken along line IV-IV in FIG. 3. FIG. 4 shows the structure of the sub-pixel 18 in the display region E1.

As shown in FIG. 4, the organic EL device 100 is provided with a base material 11, and an element substrate 10 that includes a pixel circuit 20, organic EL elements 30, a sealing layer 34 that seals the plurality of organic EL elements 30, and a color filter 36 formed in this order on the base material 11. A counter substrate 41 is provided as a second substrate arranged facing the element substrate 10.

The counter substrate 41 is formed from a transparent substrate such as glass, and is arranged facing the element substrate 10 via the filler 42 to protect the color filter 36 formed on the sealing layer 34 on the element substrate 10.

The emitted light from the functional layer 32 of the sub-pixels 18R, 18G, and 18B is reflected by a reflection layer 25, described later, and is extracted from the counter substrate 41 side while passing though the color filter 36. That is, the organic EL device 100 is a top emission-type light-emitting device.

It is possible to use a transparent substrate such as glass or a non-transparent substrate such as silicon or ceramic as the base material 11, because the organic EL device 100 is a top emission-type. Below, an example of using a thin film transistor as the pixel circuit 20 will be described.

A first insulating film 27a is formed covering the surface of the base material 11. A semiconductor layer 23a of the driving transistor 23 in the pixel circuit 20 is formed on the first insulating film 27a. A second insulating film 27b that functions as a gate insulating film is formed covering the semiconductor layer 23a. A gate electrode 23g is formed at a position facing the channel region of the semiconductor layer 23a via the second insulating film 27b. A first interlayer insulating film 24 is formed with a film thickness of 300 nm to 2 μm covering the gate electrode 23g.

The first interlayer insulating film 24 is subjected to a planarizing treatment so as to eliminate roughness of the surface arising due to covering the driving transistor 23 and the like of the pixel circuit 20. Contact holes that pass through the second insulating film 27b and the first interlayer insulating film 24 are formed corresponding to each of the source region 23s and the drain region 23d of the semiconductor layer 23a.

A conductive film is formed so as to embed the contact holes, and an electrode and a wiring connected to the driving transistor 23 are formed while being patterned. The conductive film is formed using optically reflective aluminum or an alloy or the like of aluminum and Ag (silver) or Cu (copper), and reflection layers 25 are independently formed for each sub-pixel 18 by subjecting these to patterning.

In FIG. 4, although not shown in the drawings, a switching transistor 21 and a storage capacitor 22 in the pixel circuit 20 are also formed on the base material 11.

The second interlayer insulating film 26 is formed with a thickness of 10 nm to 2 μm covering the reflection layer 25 and the first interlayer insulating film 24. Thereafter, the contact holes for electrically connecting the pixel electrode 31 and the driving transistor 23 are formed passing through the second interlayer insulating film 26.

It is possible for an oxide or a nitride of silicon or an oxynitride silicon to be used as the material that configures the first insulating film 27a, the second insulating film 27b, the first interlayer insulating film 24, and the second interlayer insulating film 26.

The conductive film is formed covering the second interlayer insulating film 26 so as to embed the contact hole formed in the second interlayer insulating film 26, and the pixel electrodes 31 (31R, 31G, 31B) are formed by patterning the conductive film. The pixel electrode 31 (31R, 31G, 31B) is formed using a transparent conductive film such as indium tin oxide (ITO). In a case where the reflection layer 25 is not provided for each sub-pixel 18, the pixel electrodes 31 (31R, 31G, 31B) may be formed using aluminum or an alloy thereof having optical reflectivity.

A barrier 28 is formed while covering the outer edge portion of each pixel electrode 31R, 31G, and 31B. Thereby, the opening portion 28a is formed on the pixel electrodes 31R, 31G, and 31B. The barrier 28 is formed using an acrylic light sensitive resin, so as to partition each of the pixel electrodes 31R, 31G, and 31B at a height of approximately 1 μm.

In the embodiment, although the barrier 28 formed from a light sensitive resin is formed in order for each of the pixel electrodes 31R, 31G, and 31B to enter a mutually insulated state, each of the pixel electrodes 31R, 31G, and 31B may be partitioned using an inorganic insulating material such as silicon oxide.

The functional layer 32 is formed using a vapor phase process such as a vacuum deposition method or an ion plating method so as to contact each pixel electrode 31R, 31G, and 31B, and the surface of the barrier 28 is covered with the functional layer 32. Since the functional layer 32 may be formed in a region partitioned by a barrier 28 without the need for the functional layer 32 to cover the entire surface of the barrier 28, it is not necessary for the apex portion of the barrier 28 to be covered by the functional layer 32.

The functional layer 32 includes a hole injection layer, a hole transporting layer, an organic light emission layer and an electron transporting layer. In the embodiment, the functional layer 32 is formed by forming and layering each of the hole injection layer, the hole transporting layer, the organic light emitting layer, the electron transporting layer in order on the pixel electrode 31 using a vapor phase process. The layer configuration of the functional layer 32 is not limited thereto, and an intermediate layer that controls the movement of holes and electrodes that are the carrier may be included.

The organic light emitting layer may be formed in a configuration from which white light emission is obtained, and it is possible to employ a configuration in which an organic light emitting layer from which red light emission, an organic light emitting layer from which green light emission is obtained, and an organic light emitting layer from which blue light emission is obtained are combined.

The counter electrode 33 as a shared cathode is formed covering the functional layer 32. The counter electrode 33 is formed by forming an alloy of Mg and Ag with a film thickness to an extent at which optical transparency and optical reflectivity are obtained (for example, 10 nm to 30 nm). Thereby, a plurality of organic EL elements 30 is completed.

By forming the counter electrode 33 in a state of having optical transparency and optical reflectivity, an optical resonator may be configured between the reflection layer 25 and the counter electrode 33 for each of the sub-pixels 18R, 18G, and 18B.

Next, the sealing layer 34 that covers the plurality of organic EL elements 30 so that water, oxygen and the like do not infiltrate is formed. The sealing layer 34 of the embodiment includes a first sealing layer 34a, a second sealing layer 34b, and a third sealing layer 34c layered in order from the counter electrode 33 side.

It is preferable to use an inorganic material having optical transparency and excellent gas barrier properties such as silicon oxynitride (SiON) as the first sealing layer 34a and the third sealing layer 34c.

Examples of the method of forming the first sealing layer 34a and the third sealing layer 34c include a vacuum deposition method. High gas barrier properties can be realized by making the film thickness of the first sealing layer 34a and the third sealing layer 34c thick; however, on the other hand, cracks easily arise due to expansion and compression. Accordingly, it is preferable to control the film thickness to approximately 200 nm to 400 nm, and, in the embodiment, high gas barrier properties are realized by overlapping the first sealing layer 34a and the third sealing layer 34c with the second sealing layer 34b interposed.

It is possible for the second sealing layer 34b to be formed using an epoxy resin or a coating-type inorganic material (such as silicon oxide) with excellent thermal stability. If the second sealing layer 34b is formed by coating with a printing method such as screen printing, and fixed amount discharge method, it is possible to planarize the surface of the second sealing layer 34b. That is, it is possible for the second sealing layer 34b to be caused to also function as a planarizing layer that alleviates the roughness of the surface of the first sealing layer 34a. The thickness of the second sealing layer 34b is 1 μm to 5 μm.

Colored layers 36R, 36G, and 36B are formed corresponding to each color of the sub-pixels 18R, 18G, and 18B on the sealing layer 34. Examples of the method of forming a color filter 36 that includes the colored layers 36R, 36G, and 36B include a method of forming a light sensitive resin layer by applying a light sensitive resin material that includes a coloring material, and exposing and developing the resin layer with a photolithography method. The film thickness of the colored layers 36R, 36G, and 36B may be the same for any color, or at least one color may be made different to the other colors.

The element substrate 10 and the counter substrate 41 are arranged so as to face via the filler 42 formed from a transparent resin material or the like. Possible examples of the transparent resin material include resin materials such as urethane-, acrylic-, epoxy-, and polyolefin-based resin materials.

Overall Structure of Organic EL Device of First Embodiment

Figure 5:
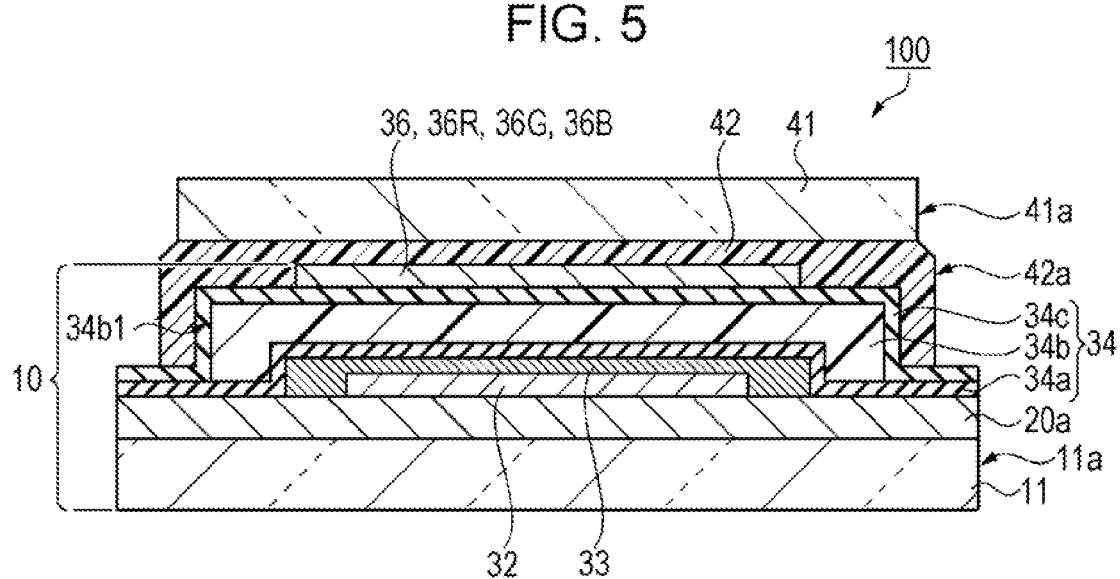
FIG. 5 is a schematic cross-sectional view of the organic EL device shown in FIG. 2 taken along the line V-V.

Next, the overall structure of the organic EL device of the first embodiment will be described with reference to FIG. 5. FIG. 5 is a schematic cross-sectional view of the organic EL device shown in FIG. 2 taken along the line V-V. Because the outer peripheral portion in the organic EL element is mainly described, a detailed depiction of the pixel circuit 20, the organic EL element 30 and the like will be omitted.

As shown in FIG. 5, the organic EL device 100 of the first embodiment, as described above, is provided with a pixel circuit layer 20a in which a driving transistor 23 or the like is formed on the base material 11 that configures the element substrate 10. The functional layer 32 having an organic light emitting layer and the like is provided on the pixel circuit layer 20a. The functional layer 32 is covered by the counter electrode 33 that functions as a cathode.

The first sealing layer 34a that configures the sealing layer 34 is formed across the entire counter electrode 33 and base material 11 on the counter electrode 33. The second sealing layer 34b is formed on the first sealing layer 34a. The end portion 34b1 of the second sealing layer 34b is arranged so as to be further to the inside (so as to become smaller) than the end portion 41a of the counter substrate 41 in plan view. In other words, the second sealing layer 34b is formed so as to be covered by the counter substrate 41 in plan view.

The third sealing layer 34c is formed over the entire second sealing layer 34b and base material 11 on the second sealing layer 34b. The color filter 36 is formed so as to include the region of the functional layer 32 in plan view on the third sealing layer 34c. The filler 42 is provided on the color filter 36. The end portion 42a of the filler 42 is arranged so as to be between the end portion 34b1 of the second sealing layer 34b and the end portion 11a of the base material 11.

The thickness of the filler 42 is 10 μm. The preferable range is approximately 2 μm to 30 μm. When the filler 42 is thin, there is concern of foreign materials coming in contact with and damaging the sealing layer 34. Whereas, when the filler 42 is thick, the organic EL device 100 becomes larger. Furthermore, there is concern of optical loss occurring when the thickness of the filler 42 is thick.

The counter substrate 41 is arranged on the filler 42. The end portion 41a of the counter substrate 41 is preferably arranged further to the inside than the end portion 11a of the base material 11 in plan view so that the filler 42 does not protrude from the end portion 11a of the base material 11 in plan view.

As long as the distance from the end portion 42a of the filler 42 to the end portion 34b1 of the second sealing layer 34b is approximately 0.1 mm to 0.5 mm, it is possible to reliably protect the second sealing layer 34b. The distance (also referred to as thickness) from the end portion 42a of the filler 42 to the end portion 34b1 of the second sealing layer 34b is longer than the thickness of the filler 42. It is preferable that the distance from the end portion 42a of the filler 42 to the end portion 34b1 of the second sealing layer 34b differs by one digit or more from the thickness of the filler 42.

The width by which the filler 42 protrudes from the counter substrate 41 is approximately 10 to 300 μm. The width can be adjusted according to the coating amount and thickness of the pressing force of the filler 42.

The distance from the display region to the end portion 34b1 of the second sealing layer 34b is 0.5 mm to 1.0 mm. The distance from the end portion 34b1 of the second sealing layer 34b to the end portion 41a of the counter substrate 41 is approximately 0.3 mm to 0.8 mm.

That is, the end portion 34b1 of the second sealing layer 34b is arranged on the display region side. In so doing, compared to a case where the end portion 34b1 of the second sealing layer 34b is arranged on the end portion 41a of the counter substrate 41 side, it is possible to reliably protect the second sealing layer with the filler 42 and the counter substrate 41.

By doing so, since the second sealing layer 34b that serves a function as a planarizing layer that configures the sealing layer 34 is covered by the counter substrate 41 in plan view, it is possible to prevent the second sealing layer 34b from breaking due to contact from the outside. In so doing, it is possible to suppress infiltration of moisture from the sealing layer 34, thereby contributing to damage of the organic EL element 30.

Additionally, since the end portion 41a of the counter substrate 41 is arranged so as to be further to the inside than the end portion 11a of the base material 11, it is possible for the filler 42 protruding to the neighboring organic EL device 100 side as in a case of forming the plurality of organic EL devices 100 at the same time on a large substrate 11W (refer to FIG. 7A) to be suppressed without the display region spreading excessively. It is possible to provide a small organic EL device 100.

Method of Manufacturing Organic EL Device

Figure 6:
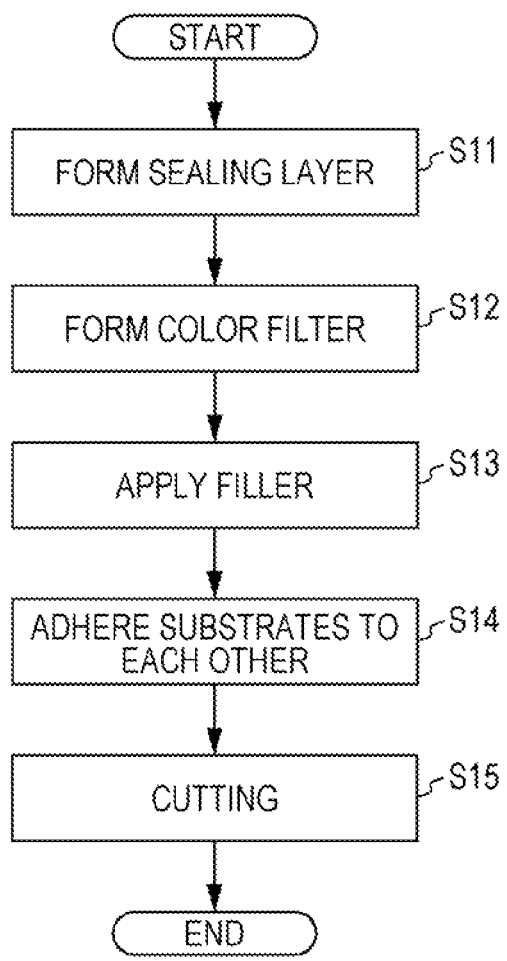
FIG. 6 is a flowchart showing the method of manufacturing the organic EL device.
Figure 7A:
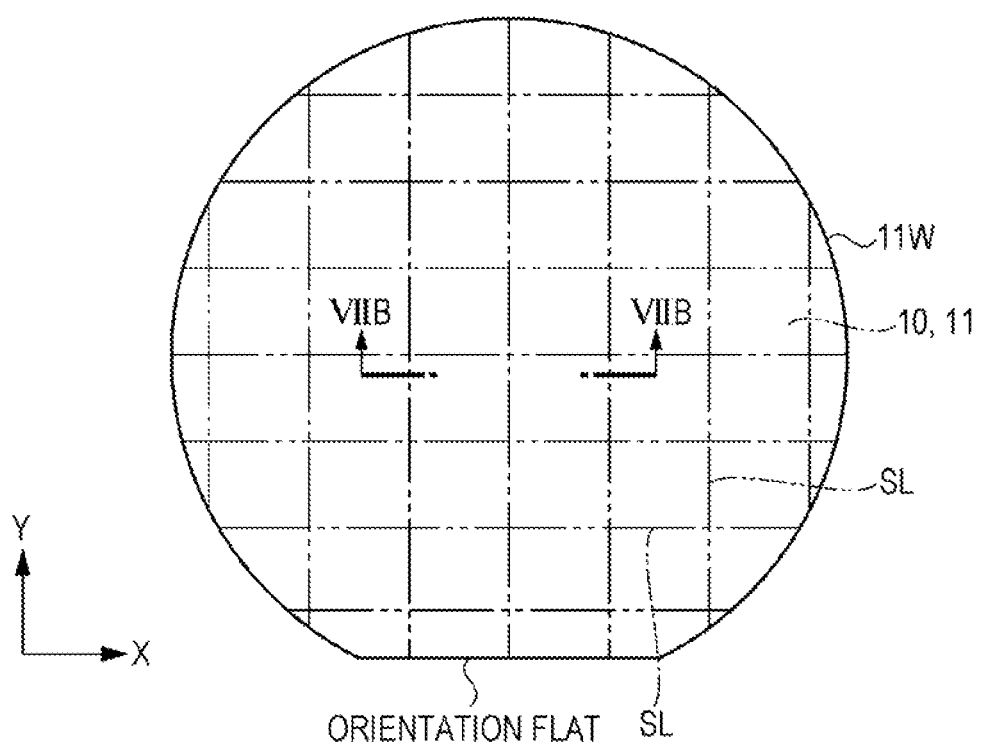
FIGS. 7A and 7B are schematic view showing a portion of the manufacturing process from the method of manufacturing an organic EL device.
Figure 7B:
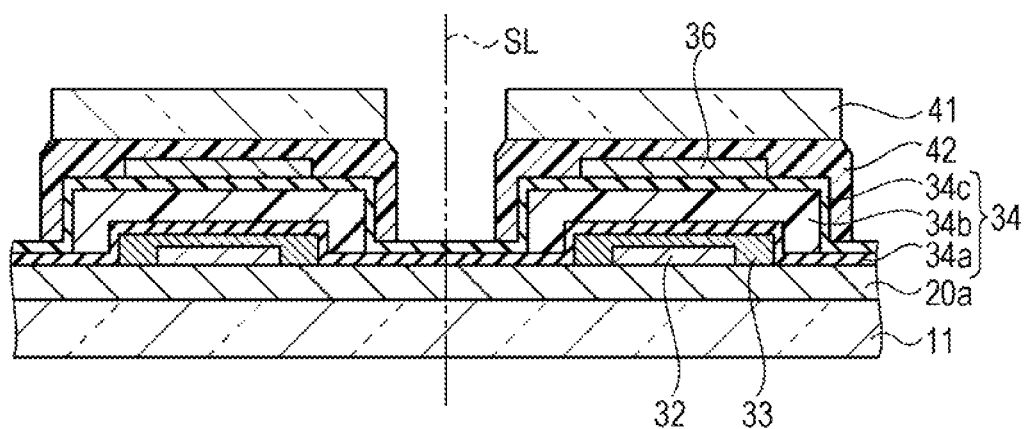

Next, the method of manufacturing the organic EL device of the first embodiment will be described with reference to FIGS. 6 to 7B. FIG. 6 is a flowchart showing the method of manufacturing the organic EL device. FIGS. 7A and 7B are schematic view showing a portion of the manufacturing process from the method of manufacturing an organic EL device.

In the embodiment, an example of forming the plurality of organic EL devices 100 at the same time on a large substrate 11W (motherboard) will be described. FIG. 7A is a schematic plan view showing a large substrate 11W to which the plurality of organic EL devices 100 is attached. FIG. 7B is a schematic cross-sectional view of the large substrate shown in FIG. 7A taken along line VIIB-VIIB.

First, the element circuit layer 20a including the pixel circuit 20 or the like, the functional layer 32 including the organic EL elements 30 and the like, and the counter electrode 33 and the like are formed on the base material 11, It is possible for the method of forming thereof to perform manufacturing using a known method.

Next, as shown in FIG. 6, in step S11, the sealing layer 34 is formed. Specifically, as shown in FIG. 7B, the first sealing layer 34a is formed so as to cover the entire counter electrode 33 and the base material 11. Example of the method of forming the first sealing layer 34a include a method of vacuum depositing an oxynitride of silicon (SiON).

Next, the second sealing layer 34b that covers the first sealing layer 34a is formed. As a method of forming the second sealing layer 34b, the second sealing layer 34b formed from an epoxy resin is formed by using a solution including an epoxy resin having transparency and a solvent of the epoxy resin, and applying and drying the solution with a printing method or a spin coating method.

The second sealing layer 34b is not limited of being formed using an organic material such as an epoxy resin, and a silicon oxide film may be formed as the second sealing layer 34b by applying a coating-type inorganic material with a printing method, and drying and baking the applied inorganic material.

The third sealing layer 34c that covers the second sealing layer 34b is formed. Examples of the method of forming the third sealing layer 34c include a method of vacuum depositing an oxynitride of silicon (SiON) similarly to the first sealing layer 34a.

Next, in the step S12, the color filter 36 (36R, 36G, 36B) is formed. Specifically, the known method forms each colored layer by forming a light sensitive resin layer by applying and drying light sensitive resins that include each coloring material with a spin coating method, and exposing and developing the light sensitive resin layer.

Next, in the step S13, the filler 42 is applied. Specifically, the transparent resin material having adhesiveness is applied so as to cover the color filter 36. The transparent resin material is, for example, a thermosetting epoxy resin.

Next, in the step S14, the counter substrate 41 is adhered. Specifically, the counter substrate 41 is arranged at a predetermined position facing the base material 11 coated with the filler 42, and the counter substrate 41 is pressed to the base material 11 side. In so doing, the element substrate 10 and the counter substrate 41 are adhered.

Next, in the step S15, as shown FIG. 7A, by cutting the large substrate 11W along a virtual scribe line SL between element substrate 10, individual organic EL devices 100 are extracted. Examples of the cutting method include an incision scribing method using an ultra-hard tip or a diamond tip and a dicing method using a diamond blade.

Through manufacturing in this way, as shown in FIG. 7B, it is possible to suppress the filler 42 protruding to the neighboring organic EL device 100 side.

Electronic Apparatus

Next, the electronic apparatus according to the embodiment will be described with reference to FIG. 8. 8 is a schematic view showing a configuration of a head mounted display (HMD) as an electronic apparatus.

Figure 8:
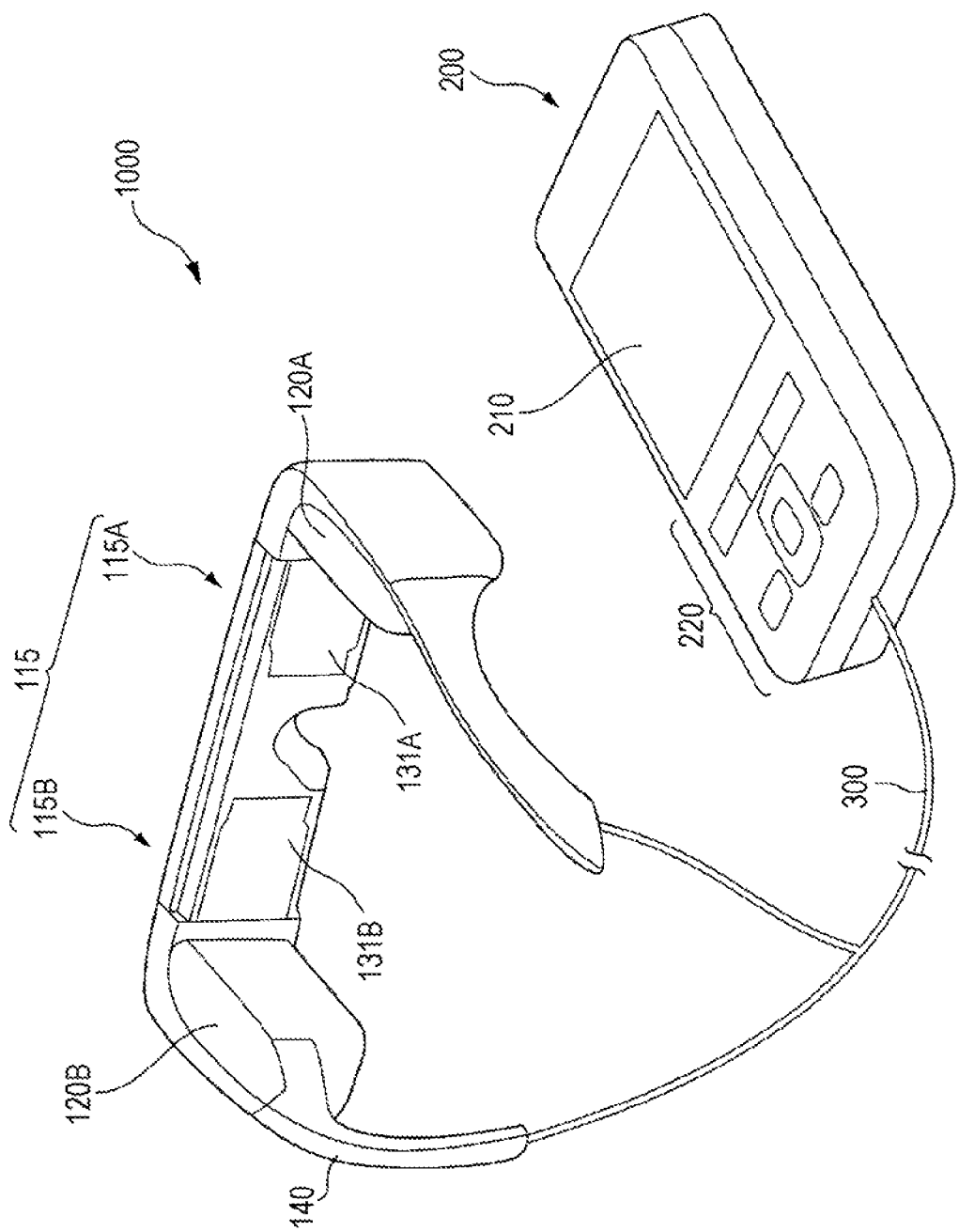
FIG. 8 is a schematic view showing a configuration of a head mounted display as an electronic apparatus.

As shown in FIG. 8, the head mounted display 1000 is provided with the above-described organic EL device 100, and is provided with main body section 115 having a glasses shape, and a controller 200 having a size approximately able to be held in the hand of a user.

The main body section 115 and the controller 200 are connected to be able to communicate in a wired manner or wirelessly. In the embodiment, the main body section 115 and the controller 200 are connected to be able to communicate with a cable 300. The main body section 115 and the controller 200 communicate image signals or control signals via the cable 300.

The main body section 115 is provided with a right eye display unit 115A and a left eye display unit 115B. The right eye display unit 115A is provided with an image forming unit 120A that forms image light of a right eye image. The left eye display unit 115B is provided with an image forming unit 120B that forms image light of left eye image.

The image forming unit 120A is accommodated in temple part (right side) of the glasses in the glasses-type main body section 115 Meanwhile, the image forming unit 120B is accommodated in temple part (left side) of the glasses in the glasses-type main body section 115.

A viewing portion 131A having optical transparency is provided in the main body section 115. The viewing portion 131A radiates image light of the right eye image toward the right eye of the user. In the head mounted display 1000, the viewing portion 131A has optical transparency, and the periphery is visible via the viewing portion 131A.

A viewing portion 131B having optical transparency is provided in the main body section 115. The viewing portion 131B radiates image light of the left eye image toward the left eye of the user. In the head mounted display 1000, the viewing portion 131E has optical transparency, and the periphery is visible via the viewing portion 131B.

The controller 200 includes an operation unit 210 and operation buttons 220. The user performs operation input with respect to the operation unit 210 or the operation button unit 220 of the controller 200, and performs instruction to the main body section 115.

It is possible to use various electronic apparatuses, in addition to the head mounted display 1000, such as a heads up display (HUD), a projector, a smartphone, an electrical view finder (EVF), a mobile telephone, a mobile computer, a digital camera, a digital video camera, a vehicle-mounted apparatus, and a lighting apparatus as the electronic apparatus to which the organic EL device 100 is mounted.

As described in detail above, according to the organic EL device 100 and electronic apparatus of the first embodiment, the effects shown below are obtained.

(1) According to the organic EL device 100 of the first embodiment, since the second sealing layer 34b is covered by the filler 42 and the counter substrate 41 in plan view, the sealing layer 34 (second sealing layer 34b) can be protected from external impact, and it is possible to suppress breakage of the second sealing layer 34b. Thus, it is possible for the infiltration of moisture and the like into the organic EL element 30 via the sealing layer 34 to be suppressed. Since the end portion 41a of the counter substrate 41 is arranged so as to be further to the inside (so as to become smaller) than the end portion 11a of the base material 11 that configures the element substrate 10, the amount that the filler 42 protrudes to the end portion 41a side of the counter substrate 41 can be suppressed, and it is possible for the non-display region becoming excessively large to be suppressed. Thus, the filler 42 protruding into the region of the neighboring organic EL device 100 as in a case of forming with a large substrate (motherboard) 11W can be suppressed.

(2) According to the organic EL device 100 of the first embodiment, in the filler 42 that covers the second sealing layer 34b, since the thickness from the second sealing layer 34b to the counter substrate 41 is thinner than the thickness from the end portion of the 34b1 of the second sealing layer 34b to the end portion 42a of the filler 42, it is possible to reduced optical loss.

(3) According to the organic EL device 100 of the first embodiment, since the distance from the end portion 34b1 of the second sealing layer 34b to the end portion 41a of the counter substrate 41 is shorter compared to the distance from the end portion of the 34b1 of the second sealing layer 34b to the end portion 42a, it is possible for the end portion 34b1 of the second sealing layer 34b being excessively covered by the filler 42 to be suppressed. Thus, the filler 42 can be prevented from protruding into the region of the neighboring organic EL device 100.

(4) According to the electronic apparatus of the first embodiment, since the organic EL device 100 is provided, it is possible to provide a highly reliable electronic apparatus.

Second Embodiment

Organic EL Device

Figure 9:
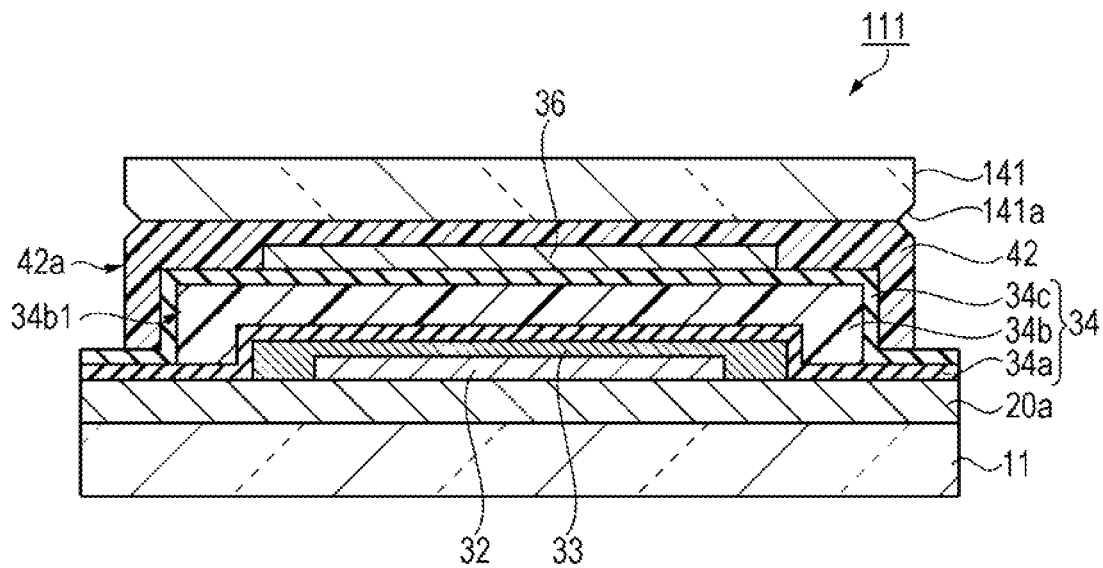
FIG. 9 is a schematic cross-sectional view showing a structure of the organic EL device of a second embodiment.

Next, the organic EL device of the second embodiment will be described with reference to FIG. 9. FIG. 9 is a schematic cross-sectional view showing a structure of the organic EL device of the second embodiment.

Compared to the organic EL device 100 of the above-described first embodiment, the organic EL device 111 of the second embodiment differs in the shape of the counter substrate 141 and the other parts are substantially the same. Therefore, in the second embodiment, the parts different to the first embodiment will be described in detail, and the other overlapping parts will not be described, as appropriate.

As shown in FIG. 9, a taper 141a of the organic EL device 111 of the second embodiment is formed on the outer peripheral edge of the filler 42 side on the counter substrate 141. Specifically, the region in which the taper 141a is formed is preferably formed at a position (further to the outside than the second sealing layer 34b in plan view) at which the sealing layer 34 does not overlap the second sealing layer 34b in plan view.

By forming the taper 141a in this way, the end portion 42a of the filler 42 can be kept between the end portion 41a of the counter substrate 41 and the end portion 34b1 of the second sealing layer 34b. In other words, the coating state of the filler 42 is easily controlled. Thus, it is possible for the filler 42 to not excessively spread, and it is possible for the filler 42 to no protrude to the region of the neighboring organic EL device 111.

By providing the taper 141a, it is possible to suppress the corners being cut thereby generating foreign materials as in a case where the outer peripheral edge of the counter substrate 141 has corners (state before tapering). Since the taper 141a is formed at a position not overlapping the second sealing layer 34b in plan view, it is possible for damage being imparted to the second sealing layer 34b by the edge of the taper 141a to be suppressed.

Even in case where the planar size of the counter substrate 41 is formed to be large compared to the first embodiment, since the taper 141a is formed, it is possible for the filler 42 protruding further to the outside than the end portion 41a of the counter substrate 41 to be suppressed.

The thickness of the filler 42 is 10 μm, similarly to the first embodiment. The preferable range is approximately 2 μm to 30 μm. The distance from the display region to the end portion 34b1 of the second sealing layer 34b is 0.5 mm to 1.0 mm. The distance from the end portion 34b1 of the second sealing layer 34b to the end portion 41a of the counter substrate 41 is approximately 0.3 mm to 0.8 mm.

As described in detail above, according to the organic EL device 111 of the second embodiment, the effects shown below are obtained.

(5) According to the organic EL device 111 of the second embodiment, since the taper 141a is formed on the outer edge of the counter substrate 41 on the filler 42 side, it is possible for the part that contacts the counter substrate 41 and the filler 42 to be further to the inside than the end portion 41a of the counter substrate 41. Thus, the amount that the filler 42 protrudes from the end portion 41a of the counter substrate 41 to the outside can be suppressed, and it is possible for the filler 42 protruding to the region of the neighboring organic EL device 111, as in a case of forming with a large substrate (motherboard) 11W to be suppressed. It is possible to control the position of the filler 42 by the taper 141a.

(6) According to organic EL device 111 of the second embodiment, since the taper 141a is formed in a region not overlapping the second sealing layer 34b, it is possible to cover the second sealing layer 34b with the filler 42, and along therewith, to keep the end portion 42a of the filler 42 so as to be between the end portion 34b1 of the second sealing layer 34b and the end portion 41a of the counter substrate 41. Thus, the filler 42 can be made to not spread excessively from the end portion 34b1 of the second sealing layer 34b to the outside, and it is possible to prevent the filler 42 from protruding to the region of a neighboring organic EL device 111.

(7) According to the organic EL device 111 of the second embodiment, by providing the taper 141a, it is possible for the corners being cut to be suppressed, thereby generating foreign materials as in a case where the outer peripheral edge of the counter substrate 141 has corners (state before tapering). Additionally, since the taper 141a is formed at a position not overlapping the second sealing layer 34b in plan view, it is possible for damage being imparted to the second sealing layer 34b by the edge of the taper 141a to be suppressed.

Third Embodiment

Organic EL Device

Figure 10:
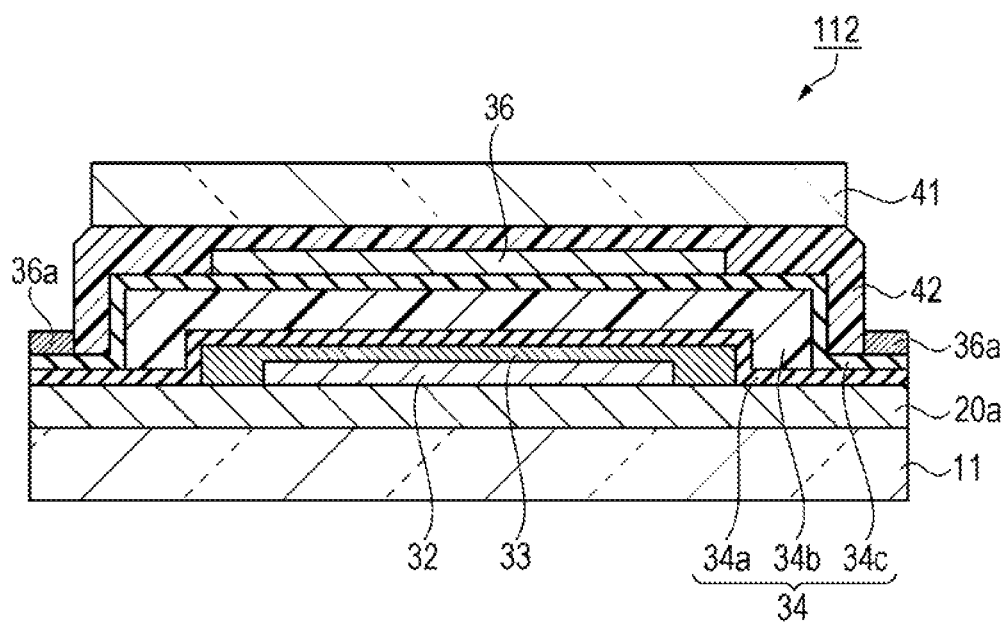
FIG. 10 is a schematic cross-sectional view showing a structure of the organic EL device of a third embodiment.

Next, the organic EL device of the third embodiment will be described with reference to FIG. 10. FIG. 10 is a schematic cross-sectional view showing a structure of the organic EL device of the third embodiment.

Compared to the organic EL device 100 of the above-described first embodiment, the organic EL device 112 of the third embodiment differs in the parts having the projection 36a between the end portion 11a of the base material 11 and the end portion 42a of the filler 42 in plan view, and the other parts are substantially the same. Therefore, in the third embodiment, the parts different to the first embodiment will be described in detail, and the other overlapping parts will not be described, as appropriate.

As shown in FIG. 10, the counter substrate 41 of the organic EL device 112 of the third embodiment is arranged so as to cover the second sealing layer 34b in plan view, as described above. Further, a projection 36a that is a characteristic part of the third embodiment is formed on the outer edge portion on the third sealing layer 34c.

The projection 36a is formed with the same material as the material of any of the color filters 36. By being formed with the same material, it is possible to form the projection 36a at the same time as the process of manufacturing the color filter 36. Thus, it is possible to manufacture the projection 36a without adding a new manufacturing process.

In this way, by forming the projection 36a, when the filler 42 is applied on the color filter 36 and when the counter substrate 41 is adhered, it is possible for the filler 42 protruding to the region of the neighboring organic EL device 112 to be suppressed. As a result, the filler 42 formed so as to cover the sealing layer 34 can be kept between the end portion 11a of the base material 11 and the end portion 34b1 of the second sealing layer 34b that configures the sealing layer 34 in plan view.

As described in detail above, according to the organic EL device 112 of the third embodiment, the effects shown below are obtained.

(8) According to the organic EL device 112 of the third embodiment, by providing the projection 36a on the third sealing layer 34c and further to the outside than the end portion 34b1 of the second sealing layer 34b, when the end portion 34b1 of the second sealing layer 34b is covered with the filler 42, it is possible for excess filler 42 protruding (flowing) to the neighboring regions to be suppressed. In other words, it is possible to keep back the filler 42. Thus, it is possible to provide an organic EL device 112 with a reduced size.

The aspects of the invention are not limited to the above-described embodiments and are able to be appropriately changed within a range not departing from the gist or spirit of the invention read from the aspects and the entire specification, and are included in the technical range of the aspects of the invention. It is possible to execute the embodiments in the following manner.

Modification Example 1

Figure 11:
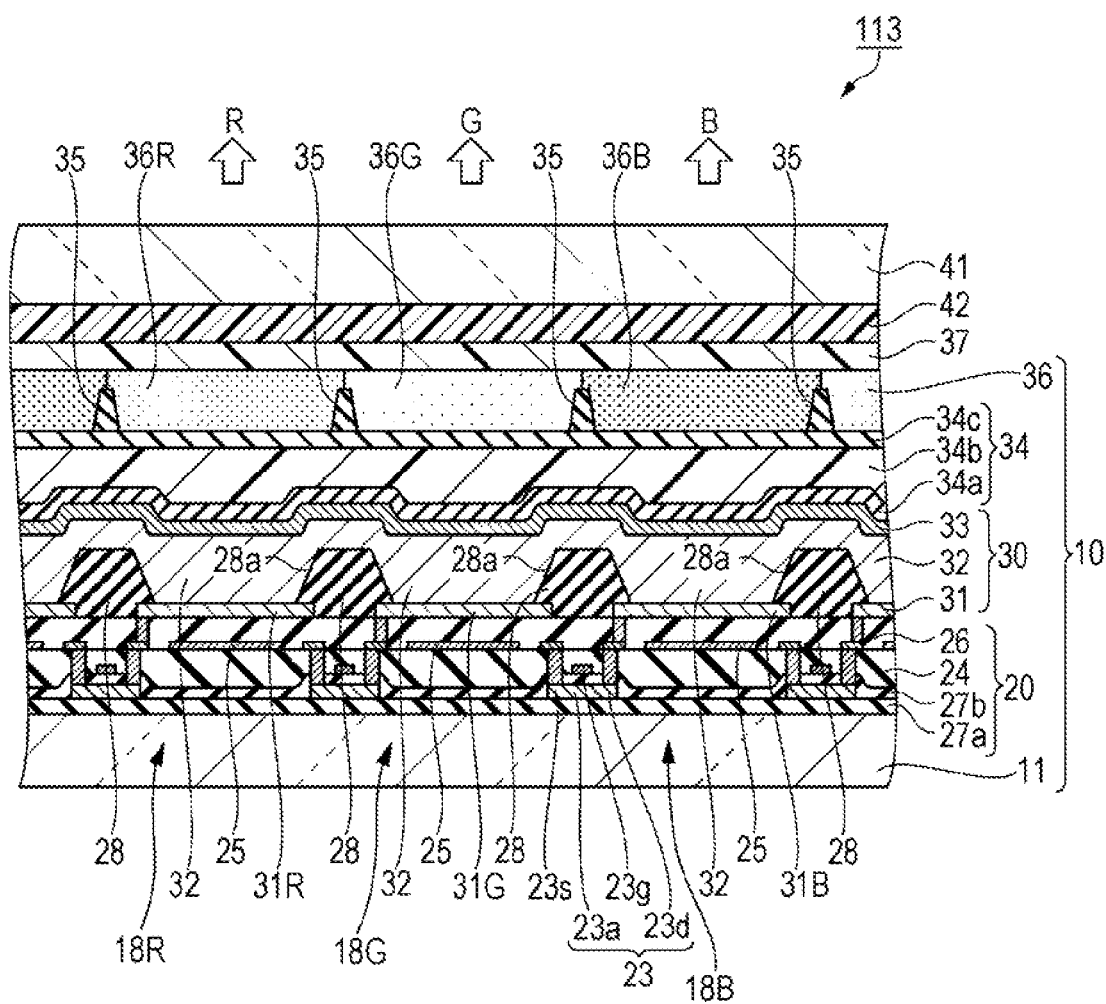
FIG. 11 is a schematic cross-sectional view showing a structure of an organic EL device of a modification example.

As in the above-described third embodiment, the material of the projection 36a is not limited to forming with the same material as the color filter 36, and the following materials may be used. FIG. 11 is a schematic cross-sectional view showing a structure of an organic EL device 113 of a modification example. The organic EL device 113 shown in FIG. 11 exhibits a cross-sectional structure of a pixel region.

As shown in FIG. 11, the insulating layer 35 of the organic EL device 113 of the modification example is formed as a barrier layer between each colored layer 36R, 36G, and 36B that configure the color filter 36. Specifically, the insulating layer 35 is formed in a stripe form. The cross-sectional shape of the insulating layer 35 is trapezoidal shape in which the bottom surface that contacts the sealing layer 34 is larger than the apex portion.

The insulating layer 35 is formed from a light sensitive resin material not including a coloring material. That is, the method of forming the insulating layer 35 forms the insulating layer 35 by applying a light sensitive resin material not including a coloring material across the entire surface of the base material 11 using a spin coating method or the like, thereby forming the light sensitive resin layer, and exposing and developing the light sensitive resin layer.

In the formation process of the color filter 36, each colored layer 36R, 36G, and 36B is formed between the insulating layers 35 by applying a light sensitive resin material including a coloring material across the entire surface of the base material 11 using a spin coating method or the like covering the insulating layer 35, thereby forming the light sensitive resin layer, and exposing and developing the light sensitive resin layer. Accordingly, the height of the insulating layer 35 on the sealing layer 34 is smaller (lower) than the thickness of each colored layer 36R, 36G, and 36B.

In this way, as long as the insulating layer 35 is formed between the colored layers of the different colors of sub-pixels 18, since the proportion of emitted light from the organic EL element 30 of the different colors of sub-pixels 18 that passes through the colored layer with a color different to the colored layer originally to be passed through is reduced, it is possible to reduce variations in the mixed color of red light and green light, green light and blue light, and blue light and red light and the color balance in the viewing angle characteristics.

In this way, in a case of an aspect of forming the insulating layer 35, it is possible to use the material of the insulating layer 35 in the projection. Since it is possible to manufacture the projection with the same process as the manufacturing process of the insulating layer 35, it is possible to manufacture the projection without newly adding a manufacturing process.

As shown in FIG. 11, an overcoating layer 37 is formed so as to cover the color filter 36. The overcoating layer 37 is formed with the object of relieving the roughness of the surface of the colored layers 36R, 36G, and 36B formed on the sealing layer 34, and protecting the color filter 36. The overcoating layer 37 is formed using an acrylic or polyimide light sensitive resin material so as to cover the color filter 36. The thickness of the overcoating layer 37 is approximately 0.5 μm to 1 μm.

In this way, in the case of a form that forms the overcoating layer 37, it is possible to use the material of the overcoating layer 37 as the projection. Since it is possible to manufacture the projection with the same process as the manufacturing process of the overcoating layer 37, it is possible to manufacture the projection without newly adding a manufacturing process.

As above, the projection is not limited to being formed with the material of the color filter 36, and the same material as the insulating layer 35 may be used, or the projection may be formed using the same material as the overcoating layer 37.

Modification Example 2

Figure 12:
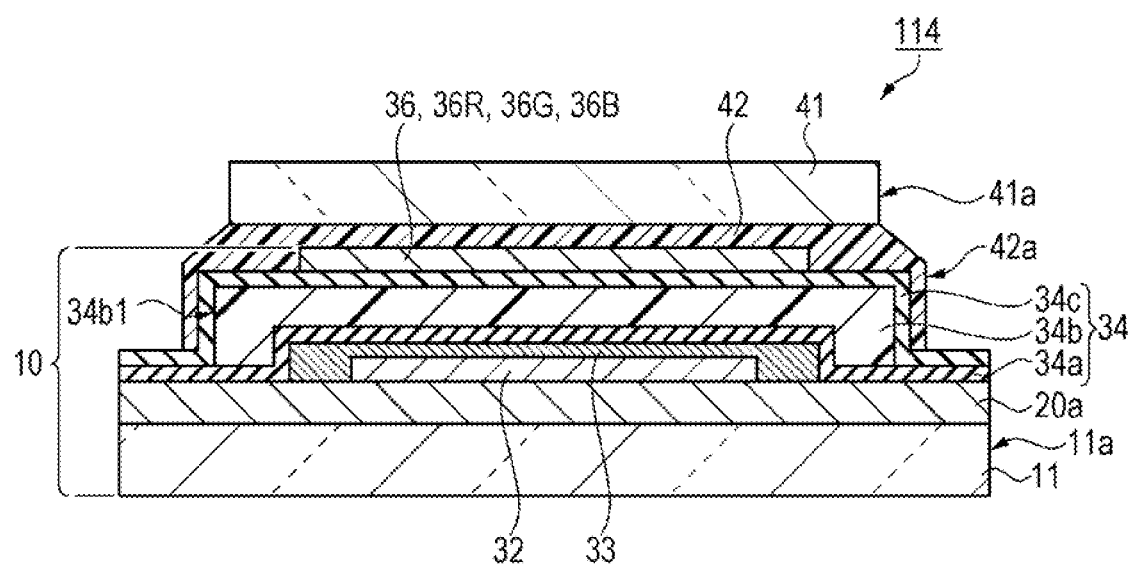
FIG. 12 is a schematic cross-sectional view showing a structure of an organic EL device of a modification example.

As described above, the end portion 34b1 of the second sealing layer 34b is not limited to being arranged further to the inside than the end portion 41a of the counter substrate 41, and may be arranged as shown in FIG. 12. FIG. 12 is a schematic cross-sectional view showing a structure of an organic EL device 114 of the modification example.

As shown in FIG. 12, the organic EL device 114 of the Modification Example 2 is configured so that the end portion 41a of the counter substrate 41 is further inside than the end portion 34b1 of the second sealing layer 34b in plan view. That is, the size of the planar counter substrate 41 is made smaller than the size of the second sealing layer 34b.

Accordingly, since the counter substrate 41 is small compared to the above-described embodiment, it is possible for the margin for ensuring the precision of positioning with the element substrate 10 to be reduced. It is possible for the filler 42 protruding to the side of the neighboring organic EL device 114 to be suppressed. Meanwhile, even though the second sealing layer 34b is a part not protected by the counter substrate 41, it is possible for the second sealing layer 34b to be protected by the filler 42.

Modification Example 3

Although the color filter 36 is arranged in the organic EL device 100 as in the above-described first embodiment, there is no limitation thereto, and a form may be used without a color filter 36.

The entire disclosure of Japanese Patent Application No.:2015-020008, filed Feb. 4, 2015 is expressly incorporated by reference herein.

What is claimed is:
1. An organic EL device, comprising:
a first substrate above which an organic EL element is provided;
a second substrate arranged so as to face the first substrate;
a sealing layer arranged between the organic EL element and the second substrate, and having at least a first sealing layer made from an inorganic material, a planarized second sealing layer, and a third sealing layer formed from an inorganic material; and
a filler arranged between the sealing layer and the second substrate,
wherein the second substrate is arranged in a region spaced by a predetermined gap from any end portion of the first substrate,
the filler is arranged so as to protrude to the gap from between the first substrate and the second substrate, and
the end portion of the second sealing layer is covered by the filler.
2. The organic EL device according to claim 1,
wherein the end portion of the second sealing layer is arranged further to the inside than the end portion of the second substrate in plan view.
3. The organic EL device according to claim 1,
wherein a distance from the end portion of the filler to the end portion of the second sealing layer is longer than the thickness of the filler between the second sealing layer and the second substrate.
4. The organic EL device according to claim 1,
wherein the second substrate is formed with a taper to the outer edge of the side on which the filler is arranged.
5. The organic EL device according to claim 4,
wherein the taper is formed at a position not overlapping the second sealing layer in plan view.
6. The organic EL device according to claim 1, further comprising;
a display region at a region that includes the organic EL element in plan view,
wherein the distance from an edge of the display region to an end portion of the second sealing layer is longer than the distance from an end portion of the second sealing layer to the end portion of the second substrate.
7. The organic EL device according to claim 1,
wherein a projection is provided on the third sealing layer and further to the outside than the second sealing layer in plan view.
8. The organic EL device according to claim 7,
wherein the projection is formed by any material of a color filter, a barrier layer arranged between the color filters, and an overcoating layer.
9. An electronic apparatus comprising:
the organic EL device according to claim 1.
10. An electronic apparatus comprising:
the organic EL device according to claim 2.
11. An electronic apparatus comprising:
the organic EL device according to claim 3.
12. An electronic apparatus comprising:
the organic EL device according to claim 4.
13. An electronic apparatus comprising:
the organic EL device according to claim 5.
14. An electronic apparatus comprising:
the organic EL device according to claim 6.
15. An electronic apparatus comprising:
the organic EL device according to claim 7.
16. An electronic apparatus comprising:
the organic EL device according to claim 8.
17. An organic EL device, comprising:
a first substrate above which an organic EL element is provided;
a second substrate arranged so as to face the first substrate;
a sealing layer arranged between the organic EL element and the second substrate, and having at least a first sealing layer made from an inorganic material, a planarized second sealing layer, and a third sealing layer formed from an inorganic material; and a filler arranged between the sealing layer and the second substrate, the filler having an end portion that extends away from the second substrate at least as far as does a region between an end portion of the first substrate and an end portion of the second substrate in a direction parallel to an upper surface of the first substrate, and the end portion of the second sealing layer is covered by the filler.

18. An electronic apparatus comprising:

the organic EL device according to claim 17.

* * * * *